United States Patent
Itabashi et al.

(10) Patent No.: US 6,989,329 B2
(45) Date of Patent: Jan. 24, 2006

(54) METHOD OF MANUFACTURING A WIRING SUBSTRATE AND AN ELECTROLESS COPPER PLATING SOLUTION FOR PROVIDING INTERLAYER CONNECTIONS

(75) Inventors: Takeyuki Itabashi, Hitachi (JP); Haruo Akahoshi, Hitachi (JP); Eiji Takai, Yokohama (JP); Naoki Nishimura, Yokohama (JP); Tadashi Iida, Atsugi (JP); Yoshinori Ueda, Hadano (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/959,073

(22) Filed: Oct. 7, 2004

(65) Prior Publication Data

US 2005/0042366 A1 Feb. 24, 2005

Related U.S. Application Data

(62) Division of application No. 09/962,249, filed on Sep. 26, 2001, now Pat. No. 6,831,009.

(30) Foreign Application Priority Data

Oct. 3, 2000 (JP) .............................. 2000-303997

(51) Int. Cl.
*H01L 21/44* (2006.01)

(52) U.S. Cl. ...................................... 438/678; 438/637
(58) Field of Classification Search ................ 438/637, 438/678
See application file for complete search history.

(56) References Cited

U.S. PATENT DOCUMENTS

| 3,645,749 | A | | 2/1972 | Paunovic |
| 3,928,663 | A | * | 12/1975 | Redmond et al. .......... 427/98.1 |
| 4,099,974 | A | | 7/1978 | Morishita et al. |
| 6,290,825 | B1 | | 9/2001 | Fu |
| 6,326,559 | B1 | | 12/2001 | Yoshioka et al. |

FOREIGN PATENT DOCUMENTS

| EP | 0 964 610 A2 | 12/1999 |
| EP | 1 194 024 A1 | 4/2002 |
| JP | 52 017334 A | 2/1977 |
| JP | 52-17335 | 2/1977 |
| JP | 52-20339 | 2/1977 |
| JP | 52-85936 | 7/1977 |
| JP | 56-105468 | 8/1981 |
| JP | 11214828 | 8/1999 |

* cited by examiner

*Primary Examiner*—Thao P. Le
(74) *Attorney, Agent, or Firm*—Antonelli, Terry, Stout and Kraus, LLP.

(57) ABSTRACT

A multilayer wiring substrate which is high in connection reliability is provided through process steps of forming more than one opening, such as a via-hole in a dielectric layer laminated on a substrate, and then applying uniform copper plating to a surface portion of the dielectric layer including the opening to thereby form a wiring layer. An electroless copper plating solution with at least one of mandelonitrile and triethyltetramine mixed therein is used to perform the intended electroless copper plating. An alternative process makes use of an electroless copper plating solution with chosen additives or "admixtures" containing at least on of mandelonitrile and triethyltetramine plus eriochrome block T along with at least one of 2,2'-bipyridyl, 1,10-phenanthroline, and 2,9-dimethyl-1,10-phenanthroline

2 Claims, 2 Drawing Sheets

METHOD OF MANUFACTURING A WIRING SUBSTRATE AND AN ELECTROLESS COPPER PLATING SOLUTION FOR PROVIDING INTERLAYER CONNECTIONS

CROSS-REFERENCE TO RELATED APPLICATIONS

This is a Divisional application of application Ser. No. 09/962,249, filed Sep. 26, 2001 now U.S. Pat. No. 6,831,009, the entire disclosure of which is hereby incorporated by reference.

BACKGROUND OF THE INVENTION

The present invention relates in general to wiring substrates; and, more particularly, the invention relates to a multilayer wiring substrate comprising a copper layer formed at a fine or "micro" opening such as via-hole, for interconnection between a plurality of wiring leads, to a method of manufacture thereof, and to an electroless copper plating solution used in the method.

Currently available electroless copper plating solutions contain copper ions, a complexing agent of copper ions, a reducing agent of the copper ions, and a pH adjuster. Such solutions further contain an additive agent mixed thereinto for purposes of improving the mechanical characteristics of a plated film(s) or, alternatively, for improving the stability of the plating solution.

One typical electroless copper plating solution containing these additive agents is disclosed, for example, in JP-A-51-105932 (1976). The plating solution taught by this Japanese document contains, as its additive agents, at least one of 2,2'-bipyridyl, 2-(2-pyridyl)benzimidazole and 2,2'-diquinolyl; at least one of polyalkylene glycol and/or 1,10-phenanthroline group; and polyalkylene glycol.

JP-A-52-17334 (1977)) discloses anelectroless copper plating solution containing, as an additive-agent, at least one of murexide, eriochrome black T, and methyl violet.

JP-A-52-17335 (1977) discloses an electroless copper plating solution containing, as an additive agent, at least one material selected from the group consisting of pyridine, 4-vinylpyridine, 2-aminopyridine, 2-methylpyridine, 3-methylpyridine-4-methylpyridine, 2-ethylpyridine, 3-(n-propyl)pyridine, and 2-hydroxypyridine.

JP-A-52-20339 (1977) teaches an electroless copper plating solution containing, as additive agents, at least one of metal salts of Ni, Co, Pb and Sn, and also a nonreactive aliphatic group polymer.

JP-A-52-21226 (1977) discloses an electroless copper plating solution containing more than one of the materials selected from the group consisting of allyl alcohol, α-chloro-allyl alcohol, β-chloroallyl alcohol, α-methylallyl alcohol, and β-methylallyl alcohol.

Furthermore, JP-A-52-85936 (1977) discloses an electroless copper plating solution containing oxime as an additive agent. JP-A-56-105468 (1981) discloses an electroless copper plating solution containing, as additive agents, polyethylene glycol stearylamine, 2,2'-bipyridyl, and $Ag_2S$. JP-A-57-26156 (1982) discloses an electroless copper plating solution with cyclic polyether added as its additive agent. JP-A-5-156459 (1993) teaches an electroless copper plating solution to which iodine compounds and 2,2'-bipyridyl are added.

Any one of the additive agents stated above can be used for the purpose of improving the mechanical characteristics of a plated film and/or the stabilities of a plating solution in which it is used. In recent years, the quest for further miniaturization or "downsizing" in electronic equipment has resulted in parts-mounting substrates being under strict requirements for achievement of higher integration densities. To meet such needs, built-up substrates offering high-integration mountability have been vigorously studied and developed by many engineers to date. Build-up substrates are typically designed to employ a via-hole structure using through-going holes that are selectively formed only at necessary interlayer portions for electrical interconnection, rather than traditional through-hole interconnection schemes using interlayer connection structures, as in conventional printed circuit boards.

With the increase in the integration densities, such via-holes decrease in diameter, resulting in an increase in the aspect ratios of via-holes to be connected by metal plating processes. In cases where plating is applied to one-side closed via-holes for achievement of an intended electrical interlayer connection, it becomes more difficult to uniformly perform metal plating within such via-holes with an increase in via-hole aspect ratios. This difficulty might often serve as a serious bar or "process bottle-neck" in the manufacture of highly integrated parts-mount substrates.

In brief, a need is felt to develop a specific technique for coating, with good reproducibility, a copper layer of uniform thickness on or over the surface of a "closed" bottom portion and/or the surface of a sidewall within an opening with large aspect ratios, wherein the film is substantially the same in thickness as a copper layer being coated on or over an upper surface.

It is therefore a primary object of the present invention to provide a new and improved wiring substrate that is capable of offering enhanced parts mountability with high integration densities.

It is another object of this invention to provide an improved multilayer wiring substrate with high-integration parts mountability, including a metal-plated wiring layer as formed at one-side closed ultrafine via-holes of high aspect ratios.

It is yet another object of the invention to provide an improved electroless copper plating solution that has excellent uniformity of deposition properties of a copper layer relative to such via-holes.

SUMMARY OF THE INVENTION

A summary of some representative principal concepts of the invention as disclosed herein will be set forth below.

Firstly, an electroless copper plating solution in accordance with the instant invention that has excellent copper layer deposition uniformity is specifically arranged to contain therein copper ions, a complexing agent of such copper ions plus a reducing agent of these ions, as well as a "pH" adjuster, with at least one of mandelonitrile and triethyltetramine being added thereto as an additive agent.

Another electroless copper plating solution in accordance with the invention that has excellent copper layer deposition uniformity is arranged to contain a copper ion, a complexing agent of the copper ion, a copper ion reducing agent, a pH adjuster and an additive agent of at least one of 2,2-bipyridyl, 1,10-phenanthroline and 2,9-dimethyl-1,10-phenanthroline, wherein at least one of mandelonitrile, triethyltetramine and eriochrome black T is further added as additive agent.

The intended multilayer wiring substrate preferably embodying the invention with a wiring layer formed through uniform plating at more than one ultra fine or "micro"

via-hole of high aspect ratio is manufacturable with increased reproducibility through electroless copper plating processes using the specific plating solution stated supra.

Practically, the above-noted electroless copper plating solution is used to apply electroless copper plating to a wiring structure which includes more than one opening having on a dielectric body surface an ultrafine diameter $\phi$ ranging from 50 to 150 $\mu$m and a closed bottom portion deeper than such diameter, i.e. whose depth is greater in value than its width, thereby enabling fabrication of a continuous copper layer with an almost uniform thickness on or over sidewall and bottom surfaces within the opening and the dielectric body surface. This in turn makes it possible to manufacture with good reproducibility the intended wiring substrate wherein the thickness of a copper layer on the sidewall/bottom surfaces within the micro-opening of aspect ratios ranging from 1.0 to 2.0 is greater than 0.9 times that of a copper layer overlying the dielectric body surface.

A further feature of the invention lies in an ability to provide, with increased reproducibility, a multilayer wiring substrate having a microfabricated high-density wiring structure, by application to an opening having a substantially perpendicular cross-section or profile having a specified angle $\beta$ which the sidewall surface within the opening forms with the dielectric body surface, wherein the angle falls within a range of from 90 to 100 degrees.

DETAILED DESCRIPTION OF THE PREFERRED EMBODIMENT

Figure 1:
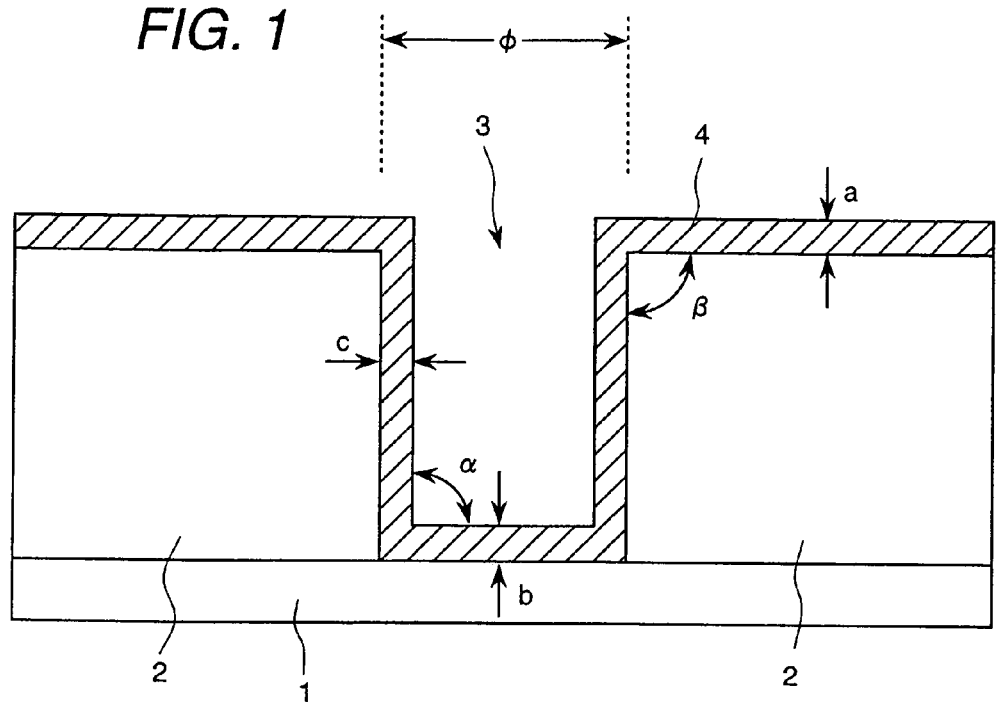
FIG. 1 is a diagram showing a cross-sectional view of a main part of a wiring substrate.

Preferred embodiments of the present invention will be explained below.

(Embodiment 1)

In this embodiment, a "basic" electroless copper plating solution contains a copper salt, a copper ion complexing agent, a reducing agent, and a pH adjuster. The copper salt may be presently available soluble copper salts including, but not limited to, copper sulfate, copper nitrate, copper chloride, and copper formate.

Examples of the complexing agent usable in this embodiment include, inter alia, ethylenediaminetetraacetic acid, hydroxy-ethylethylenetriacetic acid, cyclohexane-diamine-tetraacetic acid, diethylenetriaminepentaacetic acid, and tetrakis(2-hydroxypropyl)ethylenediamine.

Examples of the reducing agent employable herein are formaldehyde, paraformaldehyde, and glyoxylic acid. Two or more materials as selected therefrom may also be used in combination when the need arises.

Examples of the pH adjuster may be alkali hydroxides such as lithium hydroxide, sodium hydroxide and potassium hydroxide, and an organic alkali, such as tetramethyl-ammoniumhydroxide, tetraethylammoniumhydroxide or the like. While the optimal pH value range is somewhat variable depending upon the kind of reducing agent used, it is generally recommendable for the pH value as measured at 20° C. to fall within a range of from 11.5 to 13.5; preferably, the pH value is as large as possible in view of the plating rates.

The additive agent used in this embodiment for improvement of the mechanical characteristics of a resultant plated film and the stability of the plating solution may include 2,2'-bipyridyl, 1,10-phenanthroline and 2,9-dimethyl-1,10-phenanthroline, polyalkylene glycol, or other known similar suitable materials.

With the electroless copper plating solution merely consisting of the above-noted basic components and additive agent(s), it was impossible to fabricate any intended copper plated film of uniform thickness on the inside wall and bottom surfaces of certain via-holes having an aspect ratio of 1.0 or greater. The uniformity of the copper plated film thickness on the inside wall and bottom surfaces of via-holes is variable with changes in via-hole shape, the plating solution's stirring condition, the plating solution temperature, the plating rate, and the plating solution's main components. It is considered that the uniformity of deposition or "precipitation" to via-holes decreases because of the fact that the copper ions (complex) and reducing agent plus hydroxides—these are main components for plating reaction—decrease in concentration at certain portions, such as inside of the bottom-closed via-holes whereat the plating solution used fails to a offer sufficient convection current.

The inventors of the present invention have carefully studied such factors and have found that the uniformity of deposition to via-hole inner wall surfaces greatly decreases in cases where the reducing agent concentration becomes deficient, in particular.

Here, an explanation will be given of one typical deposition form of a copper-plated film onto a via-hole's inner wall surfaces including its bottom face with reference to FIG. 1, which pictorially illustrates, in cross-section, main part of a substrate having a via-hole 3. In this drawing, reference numeral "1" is used to designate an underlying or "undercoat" substrate made of a chosen electrical insulative or dielectric material; numeral 2 denotes a dielectric layer formed thereon; 3 indicates an opening such as a via-hole or the like, which has a diameter $\phi$ with its bottom surface being closed; and 4 denotes a copper plate layer that has been deposited.

Letting the thickness of a plated film on a substrate surface (i.e. top surface of dielectric layer 2) adjacent to an external entrance be represented by "a" and the thickness of a plated film as deposited at the bottom of the via-hole 3 be given as "b," a thickness ratio "b/a" is defined as expressed in a percentage (%). Based on this ratio b/a, the deposition uniformity has been evaluated. In a case where the deposition uniformity stays good, the ratio is nearly equal to 100%; if the former is bad, then the latter becomes almost 0% in value. Our evaluation was done by using, for example, a method having the steps of cutting a specified portion, including the via-hole of interest, away from a wiring substrate, embedding it into a chosen resin material, polishing the resulting body to effect exposure of a cross-section or profile at right angles to a diameter direction at the center of such via-hole, removing residual irregular polished portions of a copper plate film by use of soft etching techniques to thereby obtain the structure shown in FIG. 1, and then observing it using microscope equipment.

It should be noted that in various examples of this invention, as will be set forth later in this description, an explanation is given while using as representative the thickness "b" of such copper-plated layer on or over the inner bottom face of via-hole 3, which is predicted to be the smallest in copper film thickness values in view of the fact that in most cases a thickness "c" of a copper layer being plated on inner sidewall surfaces of the via-hole 3 often becomes substantially greater in value than the thickness b of copper layer as plated on the bottom face thereof.

In this embodiment, one significant concept is that the electroless copper plating solution further contains therein at least one of mandelonitrile and triethyltetramine in addition to the above-stated basic components thereof—i.e. the copper salt, copper ion complexing agent, reducing agent, and pH adjuster stated supra—to thereby enable fabrication of a uniform plated film at a via-hole of high aspect ratio. Merely adding mandelonitrile and/or triethyltetramine to the basic components of the electroless copper plating solution makes it possible to improve the deposition uniformity, resulting in demonstrable improvement of via-hole interconnection reliability of build-up substrates having via-hole structures.

Another advantage of the mandelonitrile/triethyltetramine addition lies in an ability to achieve an enhanced plating rate adjustability. The term "plating rate" as used herein is represented by a thickness of copper deposited on a unit area after elapse of a unit time, usually expressed in micrometers per hour ($\mu$m/h).

Although it has already been stated that the inventors have found that the shortage of the reducing agent within via-holes can cause reduction of the uniformity of deposition to via-hole innerwall surfaces, it has been further found that the mandelonitrile and/or triethyltetramine as newly added may also serve to compensate for such reducing agent shortage within the via-holes concerned.

An explanation will next be given of a function mechanism as to improvements in uniformity of deposition to via-holes due to additional mixture of mandelonitrile and/or triethyltetramine, in particular, with co-use of formaldehyde as the reducing agent by way of example.

Typically the formaldehyde is oxidized through the following elementary reaction, thus generating and releasing electrons.

  (1)

  (2)

  (3)

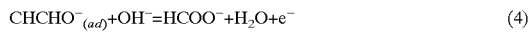  (4)

  (5)

In the primary reaction shown above, suffix "(ad)" is used to indicate that a reactive intermediate material with this suffix added thereto has been adsorbed onto the surface of a target plating body of interest. Here, a specific reactive intermediate represented as "CHOHO$^-_{(ad)}$" as found in reaction formulas (3) and (4) behaves to activate deposition reaction of copper, which may be a local cathode reaction during plating reaction. This has been studied by Harm Wiese et al. and disclosed in Ber. Bunsenges. Phys. Chem. 91, pp. 619–626 (1987).

Accordingly, a decrease in formaldehyde concentration results not only in a decrease in plating rates due to reduction of the concentration of formaldehyde for use as an electron supplier, but also result in a decrease in the concentration of the reactive intermediate which is adsorbed on the surface to activate the copper deposition reaction. Thus, the resultant plating rate at a part where the formaldehyde concentration has decreased tends to noticeably decrease when compared to plating rates at other portions with significant formaldehyde concentration values.

In other words, the plating deposition amount within via-holes having less formaldehyde concentration becomes much smaller than those on substrate surfaces having large formaldehyde concentrations, resulting in a likewise decrease in uniformity of deposition to the inside of via-holes. This can be said because not only differences of local formaldehyde concentrations within via-holes and on the surfaces thereof, but also differences of the adsorption amount of formaldehyde reaction intermediate thereonto would serve to accelerate reduction of the deposition uniformity.

The inventors of the present invention have found that any possible influence of the above-noted formaldehyde reaction intermediate concentration reduction may be suppressed by additional mixture of mandelonitrile and/or triethyltetramine in the electroless copper plating solution being used. We consider that this is because mandelonitrile and triethyltetramine per se behave to adsorb on target surfaces being plated and then mutually react with other formaldehyde reactive intermediates that have also been adsorbed thereon. Another cause considered is mutual reaction between such surface-adsorbed mandelonitrile/triethyltetramine and copper ions involved.

The above is considered to be the function mechanism for improvement in the uniformity of deposition to the inside of via-holes in the event that mandelonitrile and triethyltetramine are additionally mixed into the plating solution being used.

On the contrary, an electroless copper plating solution with eriochrome black T added thereto has been disclosed in JP-A-52-17334 (1977); however, this Japanese document is silent about the plating deposition uniformity. The feature as taught thereby is that addition of eriochrome black T is merely for improving the elasticity or plasticity of plated films—in particular, the extensibility thereof.

Although we have studied and discussed this issue while adding eriochrome black T to the plating solution being used, it was found out that addition of eriochrome black T alone fails to offer any appreciable improvement in the uniformity of deposition to via-holes. More specifically, the deposition uniformity is no longer improved in the case of mere addition of eriochrome black T to the electroless copper plating solution which consists of the aforesaid main components of copper salt, copper ion complexing agent, reducing agent, and pH adjuster. We have discovered through studies many kinds of additive agents that in cases where eriochrome black T is employed, deposition uniformity improvements are obtainable with co-use of at least one of 2,2'-bipyridyl, 1,10-phenanthroline and 2,9-dimethyl-1,10-phenanthroline.

Typically, plated films are improved in mechanical characteristics upon additional mixture of at least one of 2,2'-bipyridyl, 1,10-phenanthroline and 2,9-dimethyl-1,10-phenanthroline into the electroless copper plating solution; similarly, plated film extensibilities are also improved by addition of 2,2'-bipyridyl, 1,10-phenanthroline and/or 2,9-dimethyl-1,10-phenanthroline in the case of co-use of eriochrome black T also. Furthermore, in the case of using mandelonitrile and/or triethyltetramine as the additive agent(s) also, addition of at least one of 2,2'-bipyridyl, 1,10-phenanthroline and 2,9-dimethyl-1,10-phenanthroline results in an improvement in the plated film's mechanical properties, particularly the extensibilities thereof, thus permitting resultant plated films to become resiliency-richones. As stated above, adding at least one of 2,2'-bipyridyl, 1,10-phenanthroline and 2,9-dimethyl-1,10-phenanthroline to an electroless copper plating solution that contains at least one of mandelonitrile, triethyltetramine and eriochrome black T makes it possible to improve the mechanical physical properties of the resulting plated film while at the same time letting a wiring substrate with via-hole interconnections that have been completed using this plating solution offer significantly superior via-hole interconnection reliability.

A further effect of the present invention is that addition of at least one of 2,2'-bipyridyl, 1,10-phenanthroline and 2,9-dimethyl-1,10-phenanthroline to the electroless copper plating solution containing at least one of mandelonitrile and triethyltetramine as mixed thereinto results in a further improvement in uniformity of deposition to via-holes concerned. It was found that when compared to the case of adding mandelonitrile or triethyltetramine alone, further addition of at least one of 2,2'-bipyridyl, 1,10-phenanthroline and 2,9-dimethyl-1,10-phenanthroline advantageously leads to improvements in uniformity of deposition to via-holes.

Mere addition of mandelonitrile or triethyltetramine alone to an electroless copper plating solution results in achievement of the effect of improving the uniformity of deposition to via-holes. Regarding the eriochrome black T, its sole use lacks such effect; however, the co-use with at least one of 2,2'-bipyridyl, 1,10-phenanthroline and 2,9-dimethyl-1,10-phenanthroline permits achievement of demonstrable improvements in uniformity of deposition to via-holes, as compared to the case of adding eriochrome black T alone to the electroless copper plating solution or alternatively the case of simply adding at least one of 2,2'-bipyridyl, 1,10-phenanthroline and 2,9-dimethyl-1,10-phenanthroline to such electroless copper plating solution.

Additionally, in case of the co-use of at least one of 2,2'-bipyridyl, 1,10-phenanthroline and 2,9-dimethyl-1,10-phenanthroline with mandelonitrile or triethyltetramine also, the resultant deposition uniformity improves more significantly than the case of the sole use thereof, resulting in further improvement of the mechanical physical properties of the plated films thus fabricated.

The intended plated film which is excellent in uniformity of deposition to via-holes is obtainable by addition of mandelonitrile and/or triethyltetramine to the electroless copper plating solution. Similar results may also be obtained by addition of mandelonitrile, triethyltetramine and/or eriochrome black T to the electroless copper plating solution with at least one of 2,2'-bipyridyl, 1,10-phenanthroline and 2,9-dimethyl-1,10-phenanthroline being added thereto.

Also, more importantly, a wiring substrate with wiring leads including via-hole interconnections as fabricated by use of the plating solution containing therein mandelonitrile and/or triethyltetramine or alternatively at least one of 2,2'-bipyridyl, 1,10-phenanthroline and 2,9-dimethyl-1,10-phenanthroline along with mandelonitrile, triethyltetramine and/or eriochrome black T advantageously offers excellent connection reliability.

This advantage is due to the fact that the use of the electroless copper plating solution incorporating the principles of this invention ensures establishment of uniform deposition of a plated film onto a via-hole with its one side closed, i.e. one having a bottom portion, resulting in an increase in reliability of electrical connection to conductors, such as wiring layers or other elements. Further, owing to such enhanced ability for deposition to such a via-hole, the invention may also be applied to wiring substrates with ultrafine or "micro" via-holes while simultaneously improving the degree of freedom or flexibility of substrate wiring designs substantially, when compared to prior art schemes.

Consequently, a method of manufacturing a multilayer wiring substrate of the build-up type, including the steps of forming a dielectric layer on or over an underlying "undercoat" substrate having a wiring layer, forming in this dielectric layer more than one via-hole deep enough to reach the wiring layer on the surface of the substrate, applying electroless copper plating to at least part of the dielectric layer surface including inner wall faces of the via-hole to thereby form a second conductive layer, and forming a wiring lead pattern on or over said dielectric layer surface, involves via-hole plating by use of a specific electroless copper plating solution containing at least one of mandelonitrile and triethyltetramine as mixed thereinto for use as additive agent, and has the advantage of being able to produce an intended wiring substrate which is excellent in electrical interconnection reliability.

The electroless copper plating solution is replaceable by one that contains as additives at least one of 2,2'-bipyridyl, 1,10-phenanthroline and 2,9-dimethyl-1,10-phenanthroline with any one of mandelonitrile, triethyltetramine and eriochrome black T being further added thereto.

Furthermore, a significant advantage of the wiring substrate manufacturing method lies in its demonstrable ability to improve wiring substrate manufacturing throughputs. This can be said because the time taken to perform plating processes can be shortened owing to the use of such plating solution that produces excellent uniformity of deposition to via-holes. This is due to the fact that, although a plated film being deposited within a via-hole should be required to increase in thickness in order to provide the required connection reliability of the wiring substrate, the electroless copper plating solution designed for use with the wiring substrate manufacturing method of this invention is more excellent in uniformity of deposition to via-holes than prior known ones, so that via-hole plating processing required for achievement of higher reliability may be completed with a shortened plating time period as compared to prior art methods.

It was also confirmed by the inventors, through studies about not only via-hole diameters and aspect ratios, but also the cross-sectional shapes thereof, along with deposition uniformities of electroless copper plated layers, that the above-stated effects and advantages of the invention are also achievable even in wiring structures having tightly slanted or precipitous profiles in which an angle that is formed between the surface of dielectric layer 2 shown in FIG. 1 and the sidewall surface of a via-hole defined by dielectric layer 3 falls within a range of 90 to 100 degrees. This is significantly effective for accomplishment of multilayer wiring structures of higher densities.

An explanation will be given of several examples of the present invention below. Additionally some examples for comparison purposes only, as will be set forth later in this description, are the ones that make use of electroless copper plating solutions incorporating none of the principles of this invention.

(Embodiment 1)

While employing copper sulfate as a copper ion source and formalin as a copper ion reducing agent, electroless copper plating was performed, with sodium hydroxide being used as pH adjuster.

Presented below is the composition of a plating liquid or solution along with several plating process conditions.

| Plating Solution Composition: | |
| --- | --- |
| copper sulfate pentahydrate | 0.04 mol/l |
| ethylene-diaminetetraacetic acid | 0.1 mol/l |
| formaldehyde | 0.03 mol/l |
| sodium hydroxide | 0.01 mol/l |
| mandelonitrile | 0.0005 mol/l |

Note here that the concentration of sodium hydroxide was appropriately adjusted so that pH=12.3 on a case-by-case basis.

| Plating Conditions: | |
| --- | --- |
| pH | 12.3 |
| liquid temperature | 70° C. |

Using the electroless copper plating solution, plating was applied to more than one via-hole formed on a test substrate; then, the resulting uniformity of deposition to inner wall faces of a via-hole was evaluated by profile observation. This test substrate was fabricated by a method that will be described below.

(Test Substrate Fabrication Method)

A copper-bonded glass epoxy substrate having on its surface a copper foil with a thickness of 18 μm was prepared. A layer of photosensitive resist was then formed on the substrate surface. After completion of patterning, an inner layer copper circuit was formed by etching techniques. After the resist was peeled-off, the inner layer copper circuit was subjected to blackening processing for making the surface rough. Next, a chosen epoxy resin film, APL-4001 commercially available from Sumitomo Bakelite Co., which has on its surface a copper foil with a thickness of 12 μm, was thermally adhered onto the glass epoxy substrate at 150° C. for thirty minutes. This film measured 80 μm in thickness.

Thereafter, a surface portion of the copper foil was etched away; then, a carbon dioxide gas laser manufactured by Hitachi Via Mechanics Co. was used to form via-holes with various diameters of φ60 μm, φ80 μm, φ100 μm, φ120 μm and φ140 μm. The pitch of these via-holes was set at 500 μm, resulting in formation of 2,000 holes with respective dimensions in a square substrate that was 100 mm long on each side.

After having formed the via-holes, desmear processing was performed by known methods using a permanganic alkali aqueous solution, followed by washing of the resulting substrate surface. Thereafter, a chosen plating catalyst processing liquid, e.g. HS-101 manufactured by Hitachi Kasei Kougyo Sha, was used to add catalyst through standard processes; then, electroless copper plating was effectuated to a thickness of about 1am, by using a thin-add electroless copper plating solution, e.g. CAST-2000 available from Hitachi Kasei Kougyo Sha. Next, backing was done at 160° C. for one hour, thus completing the test substrate.

(Physical Property Measurement-Use Plated Film Fabrication Method)

A plated film used for measurement of physical properties (mechanical characteristics of plated film) as used herein was one with a thickness of 30 μm formed on a stainless plate.

The stainless plate was put into the plating solution for effectuation of electroless copper plating while setting the liquid at a temperature of 70° C. with a load of 1 $dm^2/l$. This plate was one fabricated through the process steps of pre-immersion into a 17-% hydrochloric acid aqueous solution for two minutes, immersion into a single-fluid palladium colloid catalyzer solution (acidified aqueous solution containing a sensitizer HS101B from Hitachi Kasei Kougyo Kabushiki Kaisha) for 10 minutes, water washing, processing by a chosen accelerating agent using diluted hydrochloric acid as its main component for 5 minutes, and water washing again. During the plating process, the plating solution was stirred while flesh air was introduced constantly. During plating, supplementary feed was performed to ensure that any one of the copper ions and copper ion reducing agent are kept constant in concentration while simultaneously causing the pH value to stay at a specified level.

First, evaluation of the uniformity of plated film deposition to via-holes was carried out using the test substrate shown in FIG. 1. Plating was applied to such test substrate using the above-noted plating solution under the plating conditions for 3.0 hours. The plating rate at this time was at 8.3 μm/h; thus the resulting plated film thickness was 24.9 μm. Profile polishing was then performed for evaluation of the deposition uniformity in units of various size via-hole groups, each consisting of 100 holes. The deposition uniformity evaluation was done based on the percentage (%) of a specific ratio (b/a×100) of the plated film thickness "a" on the dielectric layer surface shown in FIG. 1 to the plated film thickness "b" at the via-hole's bottom portion.

In this embodiment, the percentage of a plated film thickness at the via-hole bottom portion of each diameter relative to the thickness value, 24.9 μm, of a plated film on the substrate surface represents the deposition uniformity. Upon execution of plating under the plating conditions of this embodiment, the deposition uniformity was as follows: 68% for a via-hole of φ60 μm, 77% for a via-hole of φ80 μm, 89% for a via-hole of φ100 μm, 96% for a via-hole of φ120 μm, and 100% for a via-hole of φ140 μm, wherein excellent deposition uniformity was obtained in each case, irrespective of the fact that the plating rate was set as high as 8.3 μm/h.

Further, the physical properties of the plated film obtained using the plating solution under the plating conditions of this embodiment have been evaluated. This evaluation was done by a process including the steps of pealing a plated coat film off from the stainless plate, cutting it into portions each having a size of 1.25 cm×10 cm, and then measuring the mechanical strength of such plated coat film by using a standard tension testing machine. As a result, the plated coat film's rate of elongation or "extensibility" was at 3.2%. This is a sufficient level of plated film physical property for provision of the intended connection reliability of a build-up substrate.

From the foregoing, it has been confirmed that the electroless copper plating solution which contains therein mandelonitrile as an additive agent is excellent in uniformity of deposition onto via-holes, clearly establishing the presence of effects of the invention. Further, the plated film's physical properties are at a level high enough to permit achievement of the intended build-up substrate connection reliability; thus, it has been confirmed that the wiring substrate manufacturing method using the electroless copper plating solution employed in this embodiment is suitable for use as a method of manufacturing build-up substrates having via-hole connection structures, leading to affirmance of the effects of this example.

(Embodiment 2)

The composition of a plating solution used in this embodiment, along with plating process conditions, are set forth below.

| Plating Solution Composition: | |
|---|---|
| copper sulfate pentahydrate | 0.04 mol/l |
| ethylene-diaminetetraacetic acid | 0.1 mol/l |
| formaldehyde | 0.03 mol/l |
| sodium hydroxide | 0.01 mol/l |
| triethylenetetramine | 0.01 mol/l |

Note that the concentration of sodium hydroxide was appropriately adjusted so that pH=12.3 was established.

| Plating Conditions: | |
|---|---|
| pH | 12.3 |
| liquid temperature | 70° C. |

The deposition uniformity and plated film's physical properties were evaluated by using a test substrate and a method of fabricating a physical property measuring plated film, plus a deposition uniformity evaluation method, all of which are similar to those in Embodiment 1 stated above. The resultant plating rate with use of the plating solution of this embodiment was 5.5 μm/h. Plating was applied to the top surface of the test substrate for 4.5 hours, thereby forming a plated film with a thickness of about 25 μm. Evaluation results of the deposition uniformity are as follows: 92% for a via-hole of φ60 μm, 99% for a via-hole of φ80 μm, and 100% for via-holes of 100 μm, φ120 μm and φ140 m. An excellent deposition uniformity was obtained irrespective of the fact that the plating rate was as high as 5.5 μm/h.

Further, the physical properties of the plated film obtained using the plating solution and the plating conditions of this embodiment were evaluated. As a result, the plated film's rate of elongation or extensibility was 3.8%. This is a sufficient level of plated film physical property for achievement of the intended connection reliability of a build-up substrate.

From the foregoing, it has been confirmed that the electroless copper plating solution containing therein triethyltetramine as an additive agent produces an excellent uniformity of deposition onto via-holes, clearly establishing the presence of effects of the invention. Further, the plated film's physical properties are at a level high enough to permit achievement of the intended build-up substrate connection reliability; thus, it has been confirmed that the wiring substrate manufacturing method using the electroless copper plating solution employed in this embodiment is suitable for use as a method of manufacturing build-up substrates having via-hole connection structures, leading to affirmance of the effects of this embodiment.

(Embodiment 3)

The composition of a plating solution used in this embodiment, along with plating process conditions are set forth below.

| Plating Solution Composition: | |
|---|---|
| copper sulfate pentahydrate | 0.04 mol/l |
| ethylene-diaminetetraacetic acid | 0.1 mol/l |
| formaldehyde | 0.03 mol/l |
| sodium hydroxide | 0.01 mol/l |
| triethylenetetramine | 0.02 mol/l |

Note that the concentration of sodium hydroxide was appropriately adjusted so that pH=12.3 was established.

| Plating Conditions: | |
|---|---|
| pH | 12.3 |
| liquid temperature | 70° C. |

The deposition uniformity and plated film's physical properties were evaluated by using a test substrate and a method of fabricating a physical property measuring plated film, plus a deposition uniformity evaluation method, all of which are similar to those in Embodiment 1 stated above. The resultant plating rate with use of the plating solution of this embodiment was 4.3 μm/h. Plating was applied to the top surface of the test substrate for 6 hours, thereby forming a plated film with a thickness of about 26 μm. Evaluation results of the deposition uniformity are as follows: 100% for all via-holes of φ60 μm to φ140 μm. Excellent deposition uniformity was obtained irrespective of the fact that the plating rate was as high as 4.3 μm/h.

Further, the physical properties of the plated film obtained using the plating solution and the plating conditions of this embodiment were evaluated. As a result, the plated film's extensibility was 3.4%. This is a sufficient level of plated film physical property for achievement of the intended connection reliability of a build-up substrate.

From the foregoing, it has been confirmed that the electroless copper plating solution containing therein triethyltetramine as additive agent is excellent in uniformity of deposition onto via-holes, clearly establishing the presence of effects of the invention. Further, the plated film's physical properties are at a level high enough to permit achievement of the intended build-up substrate connection reliability; thus, it has been confirmed that the wiring substrate manufacturing method using the electroless copper plating solution employed in this embodiment is suitable for use as a method of manufacturing build-up substrates having via-hole connection structures, leading to affirmance of the effects of this embodiment.

(Embodiment 4)

The composition of a plating solution used in this embodiment, along with plating process conditions, are set forth below.

| Plating Solution Composition: | |
|---|---|
| copper sulfate pentahydrate | 0.04 mol/l |
| ethylene-diaminetetraacetic acid | 0.1 mol/l |
| formaldehyde | 0.03 mol/l |
| sodium hydroxide | 0.01 mol/l |
| mandelonitrile | 0.0005 mol/l |
| 2,2'-bipyridyl | 0.0002 mol/l |

Note that the concentration of sodium hydroxide was appropriately adjusted so that pH=12.5 was established.

| Plating Conditions: | |
| --- | --- |
| pH | 12.5 |
| liquid temperature | 74° C. |

The deposition uniformity and plated film's physical properties were evaluated by using a test substrate and a method of fabricating a physical property measuring plated film, plus a deposition uniformity evaluation method, all of which are similar to those in Embodiment 1 stated above. The resultant plating rate with use of the plating solution of this embodiment was 5.1 μm/h. Plating was applied to the top surface of the test substrate for 5 hours, thereby forming a plated film with a thickness of about 25.5 μm. Evaluation results of the deposition uniformity are as follows: 90% for a via-hole of φ60 μm, 99% for a via-hole of φ80 μm, and 100% for via-holes of φ100 μm, φ120 μm and φ140 μm. An excellent deposition uniformity was obtained irrespective of the fact that the plating rate is as high as 5.1 μm/h.

Further, the physical properties of the plated film obtained using the plating solution and the plating conditions of this embodiment were evaluated. As a result, the plated film's extensibility was 15.3%. This is a sufficient level of plated film physical property for achievement of the intended connection reliability of a build-up substrate.

From the foregoing, it has been confirmed that the electroless copper plating solution containing therein mandelonitrile as an additive agent produces excellent uniformity of deposition to via-holes, clearly establishing the presence of effects of this embodiment. Further, the co-use with 2,2'-bipyridyl results in the plated film's physical properties becoming demonstrably excellent, which well demonstrates the presence of an ability to achieve sufficiently high connection reliability of a build-up substrate. Accordingly, it has been confirmed that the wiring substrate manufacturing method employing the electroless copper plating solution proposed herein is suitable for use as a method of manufacturing build-up substrates having via-hole connection structures, leading to affirmance of the effects of this embodiment.

(Embodiment 5)

The composition of a plating solution used in this embodiment, along with plating process conditions, are set forth below.

| Plating Solution Composition: | |
| --- | --- |
| copper sulfate pentahydrate | 0.04 mol/l |
| ethylene-diaminetetraacetic acid | 0.1 mol/l |
| formaldehyde | 0.03 mol/l |
| sodium hydroxide | 0.01 mol/l |
| triethylenetetramine | 0.01 mol/l |
| 2,2'-bipyridyl | 0.0002 mol/l |

Note that the concentration of sodium hydroxide was appropriately adjusted so that pH=12.5 was established.

| Plating Conditions: | |
| --- | --- |
| pH | 12.5 |
| liquid temperature | 74° C. |

The deposition uniformity and plated film's physical properties were evaluated by using a test substrate and a method of fabricating a physical property measuring plated film, plus a deposition uniformity evaluation method, all of which are similar to those in Embodiment 1 stated above. The resultant plating rate with use of the plating solution of this embodiment was 4.8 μm/h. Plating was applied to the top surface of the test substrate for 5 hours, thereby forming a plated film with a thickness of about 24 μm. Evaluation results of the deposition uniformity are as follows: 97% for a via-hole of φ60 μm, and 100% for all the via-holes of φ80 μm to φ140 μm. Good deposition uniformity was obtained irrespective of the fact that the plating rate is as high as 4.8 μm/h.

Further, the physical properties of the plated film obtained using the plating solution and the plating conditions of this embodiment were evaluated. As a result, the plated film's rate of elongation or extensibility was 7.8%. This is a sufficient level of plated film physical property for achievement of the intended connection reliability of a build-up substrate.

From the foregoing, it has been confirmed that the electroless copper plating solution containing therein triethyltetramine as an additive agent produces excellent uniformity of deposition to via-holes, clearly establishing the presence of effects of this embodiment. Further, the co-use with 2,2'-bipyridyl results in the plated film's physical properties becoming demonstrably excellent, which well demonstrates the presence of an ability to achieve sufficiently high connection reliability of a build-up substrate. Accordingly, it has been confirmed that the wiring substrate manufacturing method employing the electroless copper plating solution proposed herein is suitable for use as a method of manufacturing build-up substrates having via-hole connection structures, leading to affirmance of the effects of this embodiment.

(Embodiment 6)

The composition of a plating solution used in this embodiment, along with plating process conditions, as set forth below.

| Plating Solution Composition: | |
| --- | --- |
| copper sulfate pentahydrate | 0.04 mol/l |
| ethylene-diaminetetraacetic acid | 0.1 mol/l |
| formaldehyde | 0.03 mol/l |
| sodium hydroxide | 0.01 mol/l |
| eriochrome black T | 0.0002 mol/l |
| 2,2'-bipyridyl | 0.0002 mol/l |

Note that the concentration of sodium hydroxide was appropriately adjusted so that pH=12.5 was established.

| Plating Conditions: | |
|---|---|
| pH | 12.5 |
| liquid temperature | 74° C. |

The deposition uniformity and plated film's physical properties were evaluated by using a test substrate and a method for fabricating a physical property measuring plated film, plus a deposition uniformity evaluation method, all of which are similar to those in Embodiment 1. The resultant plating rate with use of the plating solution of this embodiment was 5.8 $\mu$m/h. Plating was applied to the top surface of the test substrate for 4.5 hours, thereby forming a plated film with a thickness of about 26 $\mu$m. Evaluation results of the deposition uniformity are as follows: 100% for all via-holes from $\phi$60 $\mu$m to $\phi$140 $\mu$m. Good deposition uniformity was obtained irrespective of the fact that the plating rate was as high as 5.8 $\mu$m/h.

Further, the physical properties of the plated film obtained using the plating solution and the plating conditions of this embodiment were evaluated. As a result, the plated film's rate of elongation or extensibility was 8.5%. This is a sufficient level of plated film physical property for achievement of the intended connection reliability of a build-up substrate.

From the foregoing, it has been confirmed that the electroless copper plating solution containing therein eriochrome black T and 2,2'-bipyridyl as additive agents provides an excellent uniformity of deposition to via-holes, clearly establishing the presence of the effects of this embodiment. Further, the plated film's physical properties also are excellent, which suggests that it is possible to achieve sufficiently high connection reliability of a build-up substrate. Thus, it has been confirmed that the wiring substrate manufacturing method using the electroless copper plating solution employed in this embodiment is suitable for use as a method of manufacturing build-up substrates having via-hole connection structures, leading to affirmance of effects of this embodiment.

(Embodiment 7)

The composition of a plating solution used in this embodiment, along with plating process conditions, are set forth below.

| Plating Solution Composition: | |
|---|---|
| copper sulfate pentahydrate | 0.04 mol/l |
| ethylene-diaminetetraacetic acid | 0.1 mol/l |
| formaldehyde | 0.03 mol/l |
| sodium hydroxide | 0.01 mol/l |
| eriochrome black T | 0.0005 mol/l |
| 2,2'-bipyridyl | 0.0002 mol/l |

Note that the concentration of sodium hydroxide was appropriately adjusted so that pH=12.5 was established.

| Plating Conditions: | |
|---|---|
| pH | 12.5 |
| liquid temperature | 74° C. |

The deposition uniformity and plated film's physical properties were evaluated by using a test substrate and a method of fabricating a physical property measuring plated film, plus a deposition uniformity evaluation method, all of which are similar to those in Embodiment 1. The resultant plating rate with use of the plating solution of this embodiment was 6.0 $\mu$m/h. Plating was applied to the top surface of the test substrate for 4 hours, thereby forming a plated film with a thickness of about 24 $\mu$m. Evaluation results of the deposition uniformity are as follows: 100% for all via-holes from $\phi$60 $\mu$m to $\phi$140 $\mu$m. Good deposition uniformity was obtained irrespective of the fact that the plating rate was as high as 6.0 $\mu$m/h.

Further, the physical properties of the plated film obtained using the plating solution and the plating conditions of this embodiment were evaluated. As a result, the plated film's extensibility was as good as 7.6%. This is a sufficient level of plated film physical property for achievement of the intended connection reliability of a build-up substrate.

From the foregoing, it has been confirmed that the electroless copper plating solution containing therein eriochrome black T and 2,2'-bipyridyl as additive agents is excellent in uniformity of deposition to via-holes, clearly establishing the presence of the effects of this embodiment. Further, the plated film's physical properties also are excellent, which suggests that it is possible to achieve a sufficiently high connection reliability of a build-up substrate. Thus, it has been confirmed that the wiring substrate manufacturing method using the electroless copper plating solution employed in this embodiment is suitable for use as a method of manufacturing build-up substrates having via-hole connection structures, leading to affirmance of the effects of this embodiment.

(Embodiment 8)

The composition of a plating solution used in this embodiment, along with plating process conditions, are set forth below.

| Plating Solution Composition: | |
|---|---|
| copper sulfate pentahydrate | 0.04 mol/l |
| ethylene-diaminetetraacetic acid | 0.1 mol/l |
| glyoxylic acid | 0.03 mol/l |
| sodium hydroxide | 0.01 mol/l |
| eriochrome black T | 0.0005 mol/l |
| 2,2'-bipyridyl | 0.0002 mol/l |

Note that the concentration of sodium hydroxide was appropriately adjusted so that pH=12.3 was established.

| Plating Conditions: | |
|---|---|
| pH | 12.3 |
| liquid temperature | 70° C. |

The deposition uniformity and plated film's physical properties were evaluated by using a test substrate and a method of fabricating a physical property measuring plated film, plus a deposition uniformity evaluation method, all of which are similar to those in Embodiment 1. The resultant plating rate with use of the plating solution of this embodiment was 4.7 $\mu$m/h. Plating was applied to the top surface of the test substrate for 5.5 hours, thereby forming a plated film with a thickness of about 26 $\mu$m. Evaluation results of the deposition uniformity are as follows: 100% for all via-holes from φ60 μm to φ140 μm. Good deposition uniformity was obtained irrespective of the fact that the plating rate was as high as 4.7 μm/h.

Further, the physical properties of the plated film obtained using the plating solution and the plating conditions of this embodiment were evaluated. As a result, the plated film's extensibility was as good as 9.6%. This is a sufficient level of plated film physical property for achievement of the intended connection reliability of a build-up substrate.

From the foregoing, it has been confirmed that the electroless copper plating solution containing therein eriochrome black T and 2,2'-bipyridyl as additive agents provides excellent uniformity of deposition to via-holes, clearly establishing the presence of the effects of this embodiment. Further, the plated film's physical properties also are excellent, which indicates that it is possible to achieve sufficiently high connection reliability of a build-up substrate. Thus, it has been confirmed that the wiring substrate manufacturing method using the electroless copper plating solution employed in this embodiment is suitable for use as a method of manufacturing build-up substrates having via-hole connection structures, leading to affirmance of the effects of this embodiment.

(Embodiment 9)

The composition of a plating solution used in this embodiment, along with plating process conditions, are set forth below.

| Plating Solution Composition: | |
|---|---|
| copper sulfate pentahydrate | 0.04 mol/l |
| ethylene-diaminetetraacetic acid | 0.1 mol/l |
| formaldehyde | 0.03 mol/l |
| sodium hydroxide | 0.01 mol/l |
| mandelonitrile | 0.0005 mol/l |
| polyethylene glycol (average molecular weight 600) | 0.009 mol/l |

Note that the concentration of sodium hydroxide was appropriately adjusted so that pH=12.3 was established.

| Plating Conditions: | |
|---|---|
| pH | 12.3 |
| liquid temperature | 70° C. |

The deposition uniformity and plated film's physical properties were evaluated by using a test substrate and a method of fabricating a physical property measuring plated film, plus a deposition uniformity evaluation method, all of which are similar to those in Embodiment 1. The resultant plating rate with use of the plating solution of this embodiment was 7.6 μm/h. Plating was applied to the top surface of the test substrate for 3.3 hours, thereby forming a plated film with a thickness of about 25 μm. Evaluation results of the deposition uniformity are as follows: 72% for a via-hole of φ60 μm, 79% for a via-hole of φ80 μm, 93% for a via-hole of 100 μm, and 100% for via-holes of φ120 μm and φ140 μm. Good deposition uniformity was obtained irrespective of the fact that the plating rate was as high as 7.6 μm/h.

Further, the physical properties of the plated film obtained using the plating solution and the plating conditions of this embodiment were evaluated. As a result, the plated film's extensibility was as good as 7.6%. This is a sufficient level of plated film physical property for achievement of the intended connection reliability of a build-up substrate.

From the foregoing, it has been confirmed that the electroless copper plating solution containing therein mandelonitrile and polyethylene glycol as additive agents provides excellent uniformity of deposition to via-holes, clearly establishing the presence of effects of this embodiment. Further, the plated film's physical properties also are excellent, which suggests that it is possible to achieve sufficiently high connection reliability of a build-up substrate. Thus, it has been confirmed that the wiring substrate manufacturing method using the electroless copper plating solution shown in this embodiment is suitable for use as a method of manufacturing build-up substrates having via-hole connection structures, leading to affirmance of effects of this embodiment.

(Embodiment 10)

The composition of a plating solution used in this embodiment, along with plating process conditions, are set forth below.

| Plating Solution Composition: | |
|---|---|
| copper sulfate pentahydrate | 0.04 mol/l |
| ethylene-diaminetetraacetic acid | 0.1 mol/l |
| formaldehyde | 0.03 mol/l |
| sodium hydroxide | 0.01 mol/l |
| triethyltetramine | 0.01 mol/l |
| polyethylene glycol (average molar weight 600) | 0.009 mol/l |

Note that the concentration of sodium hydroxide was appropriately adjusted so that pH=12.5 was established.

| Plating Conditions: | |
|---|---|
| pH | 12.5 |
| liquid temperature | 74° C. |

The deposition uniformity and plated film's physical properties were evaluated by using a test substrate and a method of fabricating a physical property measuring plated film, plus a deposition uniformity evaluation method, all of which are similar to those in Embodiment 1. The resultant plating rate with use of the plating solution of this embodiment was 4.9 μm/h. Plating was applied to the top surface of the test substrate for 5 hours, thereby forming a plated film with a thickness of about 25 μm. Evaluation results of the deposition uniformity are as follows: 100% for all via-holes from φ60 μm to φ140 μm. Good deposition uniformity was obtained irrespective of the fact that the plating rate was as high as 4.9 μm/h.

Further, the physical properties of the plated film obtained using the plating solution and the plating conditions of this embodiment were evaluated. As a result, the plated film's extensibility was as good as 6.8%. This is a sufficient level of plated film physical property for achievement of the intended connection reliability of a build-up substrate. From the foregoing, it has been confirmed that the electroless copper plating solution containing therein triethyltetramine and polyethylene glycol as additive agents provides excellent uniformity of deposition to via-holes, clearly establishing the presence of the effects of this embodiment. Further, the plated film's physical properties also are excellent, which suggests that it is possible to achieve sufficiently high connection reliability of a build-up substrate.

From the foregoing, it has been confirmed that the wiring substrate manufacturing method using the electroless copper plating solution employed in this embodiment is suitable for use as a method of manufacturing build-up substrates having via-hole connection structures, leading to affirmance of effects of this embodiment.

(Embodiment 11)

The composition of a plating solution used in this embodiment, along with plating process conditions, are set forth below.

| Plating Solution Composition: | |
| --- | --- |
| copper sulfate pentahydrate | 0.04 mol/l |
| ethylene-diaminetetraacetic acid | 0.1 mol/l |
| formaldehyde | 0.03 mol/l |
| sodium hydroxide | 0.01 mol/l |
| eriochrome black T | 0.0005 mol/l |
| polyethylene glycol (average molar weight 600) | 0.03 mol/l |

Note that the concentration of sodium hydroxide was appropriately adjusted so that pH=12.5 was established.

| Plating Conditions: | |
| --- | --- |
| pH | 12.5 |
| liquid temperature | 74° C. |

The deposition uniformity and plated film's physical properties were evaluated by using a test substrate and a method of fabricating a physical property measuring plated film, plus a deposition uniformity evaluation method, all of which are similar to those in Embodiment 1. The resultant plating rate with use of the plating solution of this embodiment was 7.5 $\mu$m/h. Plating was applied to the top surface of the test substrate for 3.5 hours, thereby forming a plated film with a thickness of about 26 $\mu$m. Evaluation results of the deposition uniformity are as follows: 75% for a via-hole of $\phi$60 $\mu$m, 83% for a via-hole of $\phi$80 $\mu$m, 96% for a via-hole of $\phi$100 $\mu$m, and 100% for via-holes of $\phi$120 $\mu$m and $\phi$140 $\mu$m. Good deposition uniformity was obtained irrespective of the fact that the plating rate was as high as 7.5 $\mu$m/h.

Further, the physical properties of the plated film obtained using the plating solution and the plating conditions of this embodiment were evaluated. As a result, the plated film's extensibility was as good as 5.4%. This is a sufficient level of plated film physical property for achievement of the intended connection reliability of a build-up substrate.

From the foregoing, it has been confirmed that the electroless copper plating solution containing therein eriochrome black T and polyethylene glycol as additive agents provides excellent uniformity of deposition to via-holes, clearly establishing the presence of the effects of this embodiment. Further, the plated film's physical properties also are excellent, which suggests that it is possible to achieve sufficiently high connection reliability of a build-up substrate.

Thus, it has been confirmed that the wiring substrate manufacturing method using the electroless copper plating solution employed in this embodiment is suitable for use as a method of manufacturing build-up substrates having via-hole connection structures, leading to affirmance of effects of this embodiment.

(Embodiment 12)

The composition of a plating solution used in this embodiment, along with plating process conditions, are set forth below.

| Plating Solution Composition: | |
| --- | --- |
| copper sulfate pentahydrate | 0.04 mol/l |
| ethylene-diaminetetraacetic acid | 0.1 mol/l |
| formaldehyde | 0.03 mol/l |
| sodium hydroxide | 0.01 mol/l |
| eriochrome black T | 0.0005 mol/l |
| 2,9-dimethyl-1,10-phenanthroline | 0.0001 mol/l |

Note that the concentration of sodium hydroxide was appropriately adjusted so that pH=12.5 was established.

| Plating Conditions: | |
| --- | --- |
| pH | 12.5 |
| liquid temperature | 74° C. |

The deposition uniformity and plated film's physical properties were evaluated by using a test substrate and a method of fabricating a physical property measuring plated film, plus a deposition uniformity evaluation method, all of which are similar to those in Embodiment 1. The resultant plating rate with use of the plating solution of this embodiment was 6.7 $\mu$m/h. Plating was applied to the top surface of the test substrate for 4.0 hours, thereby forming a plated film with a thickness of about 27 $\mu$m. Evaluation results of the deposition uniformity are as follows: 77% for a via-hole of $\phi$60 $\mu$m, 88% for a via-hole of $\phi$80 $\mu$m, 96% for a via-hole of $\phi$100 $\mu$m, and 100% for via-holes of $\phi$120 $\mu$m and $\phi$140 $\mu$m. Good deposition uniformity was obtained irrespective of the fact that the plating rate was as high as 6.7 $\mu$m/h.

Further, the physical properties of the plated film obtained using the plating solution and the plating conditions of this embodiment were evaluated. As a result, the plated film's extensibility was as good as 5.2%. This is a sufficient level of plated film physical property for achievement of the intended connection reliability of a build-up substrate.

From the foregoing, it has been confirmed that the electroless copper plating solution containing therein eriochrome black T and 2,9-dimethyl-1,10-phenanthroline as additive agents provides excellent uniformity of deposition to via-holes, clearly establishing the presence of effects of this embodiment. Further, the plated film's physical properties also are excellent, which suggests that it is possible to achieve sufficiently high connection reliability of a build-up substrate. Thus, it has been confirmed that the wiring substrate manufacturing method using the electroless copper plating solution employed in this embodiment is suitable for use as a method of manufacturing build-up substrates having via-hole connection structures, leading to affirmance of effects of this example.

(Embodiment 13)

The composition of a plating solution used in this embodiment, along with plating process conditions, are set forth below.

| Plating Solution Composition: | |
|---|---|
| copper sulfate pentahydrate | 0.04 mol/l |
| ethylene-diaminetetraacetic acid | 0.1 mol/l |
| formaldehyde | 0.03 mol/l |
| sodium hydroxide | 0.01 mol/l |
| mandelonitrile | 0.0005 mol/l |
| 2,9-dimethyl-1,10-phenanthroline | 0.0003 mol/l |

Note that the concentration of sodium hydroxide was appropriately adjusted so that pH=12.5 was established.

| Plating Conditions: | |
|---|---|
| pH | 12.5 |
| liquid temperature | 74° C. |

The deposition uniformity and plated film's physical properties were evaluated by using a test substrate and a method of fabricating a physical property measuring plated film, plus a deposition uniformity evaluation method, all of which are similar to those in Embodiment 1. The resultant plating rate with use of the plating solution of this embodiment was 5.3 μm/h. Plating was applied to the top surface of the test substrate for 5.0 hours, thereby forming a plated film with a thickness of about 26 μm. Evaluation results of the deposition uniformity are as follows: 91% for a via-hole of φ60 μm, and 100% for via-holes of φ80 μm, φ100 μm, φ120 μm and φ140 μm. Good deposition uniformity was obtained irrespective of the fact that the plating rate was as high as 5.3 μm/h.

Further, the physical properties of the plated film obtained using the plating solution and the plating conditions of this embodiment were evaluated. As a result, the plated film's extensibility was as good as 6.8%. This is a sufficient level of plated film physical property for achievement of the intended connection reliability of a build-up substrate.

From the foregoing, it has been confirmed that the electroless copper plating solution containing therein mandelonitrile and 2,9-dimethyl-1,10-phenanthroline as additive agents provides excellent uniformity of deposition to via-holes, clearly establishing the presence of the effects of this embodiment. Further, the plated film's physical properties also are excellent, which suggests that it is possible to achieve sufficiently high connection reliability of a build-up substrate.

Thus, it has been confirmed that the wiring substrate manufacturing method using the electroless copper plating solution employed in this embodiment is suitable for use as a method of manufacturing build-up substrates having via-hole connection structures, leading to affirmance of effects of this example.

(Embodiment 14)

The composition of a plating solution used in this embodiment, along with plating process conditions, are set forth below.

| Plating Solution Composition: | |
|---|---|
| copper sulfate pentahydrate | 0.04 mol/l |
| ethylene-diaminetetraacetic acid | 0.1 mol/l |
| formaldehyde | 0.03 mol/l |
| sodium hydroxide | 0.01 mol/l |
| triethyltetramine | 0.005 mol/l |
| 2,9-dimethyl-1,10-phenanthroline | 0.0002 mol/l |

Note that the concentration of sodium hydroxide was appropriately adjusted so that pH=12.5 was established.

| Plating Conditions: | |
|---|---|
| pH | 12.5 |
| liquid temperature | 74° C. |

The deposition uniformity and plated film's physical properties were evaluated by using a test substrate and a method of fabricating a physical property measuring plated film, plus a deposition uniformity evaluation method, all of which are similar to those in Embodiment 1. The resultant plating rate with use of the plating solution of this embodiment was 4.9 μm/h. Plating was applied to the top surface of the test substrate for 5.0 hours, thereby forming a plated film with a thickness of about 25 μm. Evaluation results of the deposition uniformity are as follows: 92% for a via-hole of φ60 μm, and 100% for via-holes of φ80 μm, φ100 μm, φ120 μm and φ140 μm. Good deposition uniformity was obtained irrespective of the fact that the plating rate was as high as 4.9 μm/h.

Further, the physical properties of the plated film obtained using the plating solution and the plating conditions of this embodiment were evaluated. As a result, the plated film's extensibility was as good as 6.9%. This is a sufficient level of plated film physical property for achievement of the intended connection reliability of a build-up substrate.

From the foregoing, it has been confirmed that the electroless copper plating solution containing therein triethyltetramine and 2,9-dimethyl-1,10-phenanthroline as additive agents provides excellent uniformity of deposition to via-holes, clearly establishing the presence of the effects of this embodiment. Further, the plated film's physical properties also are excellent, which suggests that it is possible to achieve sufficiently high connection reliability of a build-up substrate.

Thus, it has been confirmed that the wiring substrate manufacturing method using the electroless copper plating solution employed in this embodiment is suitable for use as a method of manufacturing build-up substrates having via-hole connection structures, leading to affirmance of effects of this example.

(Embodiment 15)

The composition of a plating solution used in this embodiment, along with plating process conditions, are set forth below.

| Plating Solution Composition: | |
|---|---|
| copper sulfate pentahydrate | 0.04 mol/l |
| ethylene-diaminetetraacetic acid | 0.1 mol/l |
| formaldehyde | 0.03 mol/l |

-continued

Plating Solution Composition:

| | |
|---|---|
| sodium hydroxide | 0.01 mol/l |
| mandelonitrile | 0.0005 mol/l |
| polyethylene glycol (average molar weight 600) | 0.0009 mol/l |
| 2,2'-bipyridyl | 0.0001 mol/l |

Note that the concentration of sodium hydroxide was appropriately adjusted so that pH=12.5 was established.

Plating Conditions:

| | |
|---|---|
| pH | 12.5 |
| liquid temperature | 74° C. |

The deposition uniformity and plated film's physical properties were evaluated by using a test substrate and a method of fabricating a physical property measuring plated film, plus a deposition uniformity evaluation method, all of which are similar to those in Embodiment 1. The resultant plating rate with use of the plating solution of this embodiment was 4.8 μm/h. Plating was applied to the top surface of the test substrate for 5 hours, thereby forming a plated film with a thickness of about 24 μm. Evaluation results of the deposition uniformity are as follows: 100% for all the via-holes of from φ60 μm up to φ140 μm. Good deposition uniformity was obtained irrespective of the fact that the plating rate was as high as 4.8 μm/h.

Further, the physical properties of the plated film obtained using the plating solution and the plating conditions of this embodiment were evaluated. As a result, the plated film's extensibility was 18.3% and thus was significantly excellent. This is a sufficient level of plated film physical property for achievement of the intended connection reliability of a build-up substrate.

From the foregoing, it has been confirmed that the electroless copper plating solution containing therein mandelonitrile and polyethylene glycol plus 2,2'-bipyridyl as additive agents provides excellent uniformity of deposition to via-holes, clearly establishing the presence of effects of this embodiment. Further, the plated film's physical properties also are excellent, which suggests that it is possible to achieve sufficiently high connection reliability of a build-up substrate.

Thus, it has been confirmed that the wiring substrate manufacturing method using the electroless copper plating solution employed in this embodiment is suitable for use as a method of manufacturing build-up substrates having via-hole connection structures, leading to affirmance of effects of this embodiment.

(Embodiment 16)

The composition of a plating solution used in this embodiment, along with plating process conditions, a re set forth below.

Plating Solution Composition:

| | |
|---|---|
| copper sulfate pentahydrate | 0.04 mol/l |
| ethylene-diaminetetraacetic acid | 0.1 mol/l |
| formaldehyde | 0.03 mol/l |
| sodium hydroxide | 0.01 mol/l |

-continued

Plating Solution Composition:

| | |
|---|---|
| triethyltetramine | 0.01 mol/l |
| polyethylene glycol (average molar weight 600) | 0.009 mol/l |
| 2,2'-bipyridyl | 0.0001 mol/l |

Note that the concentration of sodium hydroxide was appropriately adjusted so that pH=12.5 was established.

Plating Conditions:

| | |
|---|---|
| pH | 12.5 |
| liquid temperature | 74° C. |

The deposition uniformity and plated film's physical properties were evaluated by using a test substrate and a method of fabricating a physical property measuring plated film, plus a deposition uniformity evaluation method, all of which are similar to those in Embodiment 1. The resultant plating rate with use of the plating solution of this embodiment was 4.1 μm/h. Plating was applied to the top surface of the test substrate for 6 hours, thereby forming a plated film with a thickness of about 25 μm. Evaluation results of the deposition uniformity are as follows: 100% for all the via-holes of from φ60 μm up to φ140 μm. Good deposition uniformity was obtained irrespective of the fact that the plating rate was as high as 4.1 μm/h.

Further, the physical properties of the plated film obtained using the plating solution and the plating conditions of this embodiment were evaluated. As a result, the plated film's extensibility was at a very good value of 8.6%. This is a sufficient level of plated film physical property for achievement of the intended connection reliability of a build-up substrate.

From the foregoing, it has been confirmed that the electroless copper plating solution containing therein triethyltetramine and polyethylene glycol plus 2,2'-bipyridyl as additive agents provides excellent uniformity of deposition to via-holes, clearly establishing the presence of the effects of this embodiment. Further, the plated film's physical properties also are excellent, which suggests that it is possible to achieve sufficiently high connection reliability of a build-up substrate. Thus, it has been confirmed that the wiring substrate manufacturing method using the electroless copper plating solution employed in this embodiment is suitable for use as a method of manufacturing build-up substrates having via-hole connection structures, leading to affirmance of effects of this embodiment.

(Embodiment 17)

The composition of a plating solution used in this embodiment, along with plating process conditions, are set forth below.

Plating Solution Composition:

| | |
|---|---|
| copper sulfate pentahydrate | 0.04 mol/l |
| ethylene-diaminetetraacetic acid | 0.1 mol/l |
| formaldehyde | 0.03 mol/l |
| sodium hydroxide | 0.01 mol/l |
| eriochrome black T | 0.0005 mol/l |

-continued

| Plating Solution Composition: | |
|---|---|
| polyethylene glycol (average molar weight 600) | 0.009 mol/l |
| 2,2'-bipyridyl | 0.0001 mol/l |

Note that the concentration of sodium hydroxide was appropriately adjusted so that pH=12.5 was established.

| Plating Conditions: | |
|---|---|
| pH | 12.5 |
| liquid temperature | 74° C. |

The deposition uniformity and plated film's physical properties were evaluated by using a test substrate and a method of fabricating a physical property measuring plated film, plus a deposition uniformity evaluation method, all of which are similar to those in Embodiment 1. The resultant plating rate with use of the plating solution of this embodiment was 5.9 $\mu$m/h. Plating was applied to the top surface of the test substrate for 4.2 hours, thereby forming a plated film with a thickness of about 25 $\mu$m. Evaluation results of the deposition uniformity are as follows: 100% for all via-holes from $\phi$60 $\mu$m up to $\phi$140 $\mu$m. Good deposition uniformity was obtained irrespective of the fact that the plating rate was as high as 5.9 $\mu$m/h.

Further, the physical properties of the plated film obtained using the plating solution and the plating conditions of this embodiment were evaluated. As a result, the plated film's extensibility was 8.4% and thus significantly excellent. This is a sufficient level of plated film physical property for achievement of the intended connection reliability of a build-up substrate.

From the foregoing, it has been confirmed that the electroless copper plating solution containing therein eriochrome black T and polyethylene glycol plus 2,2'-bipyridyl as additive agents provides excellent uniformity of deposition to via-holes, clearly establishing the presence of effects of this embodiment. Further, the plated film's physical properties also are excellent, which suggests that it is possible to achieve sufficiently high connection reliability of a build-up substrate.

Thus, it has been confirmed that the wiring substrate manufacturing method using the electroless copper plating solution employed in this embodiment is suitable for use as a method of manufacturing build-up substrates having via-hole connection structures, leading to affirmance of effects of this embodiment.

(Embodiment 18)

The composition of a plating solution used in this embodiment, along with plating process conditions, are set forth below.

| Plating Solution Composition: | |
|---|---|
| copper sulfate pentahydrate | 0.05 mol/l |
| ethylene-diaminetetraacetic acid | 0.1 mol/l |
| formaldehyde | 0.03 mol/l |
| sodium hydroxide | 0.01 mol/l |
| mandelonitrile | 0.0006 mol/l |
| polyethylene glycol (average | 0.01 mol/l |

-continued

| Plating Solution Composition: | |
|---|---|
| molar weight 600) | |
| 2,2'-bipyridyl | 0.0001 mol/l |

Note that the concentration of sodium hydroxide was appropriately adjusted so that pH=12.5 was established.

| Plating Conditions: | |
|---|---|
| pH | 12.5 |
| liquid temperature | 74° C. |

The deposition uniformity and plated film's physical properties were evaluated by using a test substrate and a method of fabricating a physical property measuring plated film, plus a deposition uniformity evaluation method, all of which are similar to those in Embodiment 1. The resultant plating rate with use of the plating solution of this embodiment was 4.5 $\mu$m/h. Plating was applied to the top surface of the test substrate for 5.5 hours, thereby forming a plated film with a thickness of about 25 $\mu$m. Evaluation results of the deposition uniformity are as follows: 100% for all the via-holes of from $\phi$60 $\mu$m up to $\phi$140 $\mu$m. Good deposition uniformity was obtained irrespective of the fact that the plating rate was as high as 4.5 $\mu$m/h.

Further, the physical properties of the plated film obtained using the plating solution and the plating conditions of this embodiment were evaluated. As a result, the plated film's extensibility was at a very excellent value of 18.6%. This is a sufficient level of plated film physical property for achievement of the intended connection reliability of a build-up substrate.

From the foregoing, it has been confirmed that the electroless copper plating solution containing therein mandelonitrile and polyethylene glycol plus 2,2'-bipyridyl as additive agents provides excellent uniformity of deposition to via-holes, clearly establishing the presence of the effects of this embodiment. Further, the plated film's physical properties also are excellent, which suggests that it is possible to achieve sufficiently high connection reliability of a build-up substrate.

Thus, it has been confirmed that the wiring substrate manufacturing method using the electroless copper plating solution employed in this embodiment is suitable for use as a method of manufacturing build-up substrates having via-hole connection structures, leading to affirmance of effects of this embodiment.

(Embodiment 19)

A layer of photosensitive resist material was formed on the surface of a copper-bonded glass epoxy substrate having thereon a copper foil with a thickness of 18 $\mu$m; and, after completion of patterning, an inner layer circuit was formed by etching techniques. This circuit measured 75 $\mu$m in width and 75 $\mu$m in space, wherein square interlayer connection pads with each side of 250 $\mu$m were formed and disposed with a pitch of 1.27 mm. After having peeled off the resist, the inner layer copper circuit surface was made coarser through blackening processes. An epoxy resin film APL-4001 commercially available from Sumitomo Bakelite Co., which has on its surface a copper foil with a thickness of 12 $\mu$m, was adhered by thermo-compression bonding techniques at a temperature of 150° C. for 30 minutes. This film was 80 μm thick. Thereafter, a surface portion of the copper foil was etched away; then, a carbon dioxide gas laser manufactured by Hitachi Via Mechanics Co. was used to form a via-hole (s) of 80 μm in diameter on an interlayer connection pad(s) as formed at the inner layer. After completion of such via-hole formation, standard methodology was used to perform desmear processing using a permanganate alkaline aqueous solution; and, after having washed the resulting substrate surface, a plating catalytic processing liquid, e.g. HS-101 manufactured by Hitachi Kasei Kougyo Sha, was used to add catalyst through known processes. Thereafter, electroless copper plating was applied thereto using a thin-add electroless copper plating solution, here CAST-2000 also available from Hitachi Kasei Kougyo Sha. Then, baking was carried out at 160° C. for one hour; and, next, electroless copper plating was carried out to a thickness of 25 μm using a chosen plating solution and the plating process conditions set forth below.

| Plating Solution Composition: | |
| --- | --- |
| copper sulfate pentahydrate | 0.04 mol/l |
| ethylene-diaminetetraacetic acid | 0.1 mol/l |
| formaldehyde | 0.03 mol/l |
| sodium hydroxide | 0.01 mol/l |
| mandelonitrile | 0.0005 mol/l |

Note that the concentration of sodium hydroxide was appropriately adjusted so that pH=12.3 was established.

| Plating Conditions: | |
| --- | --- |
| pH | 12.3 |
| liquid temperature | 70° C. |

After completion of the 25-μm thickness plating processing with the plating solution composition under the plating conditions stated above, a photosensitive resist was formed on a copper-plated film, which was then subject to patterning. The pattern thus formed has a structure with a linear array of 2,500 via-holes, which structure is used for measurement of the chain resistivity of these via-holes. Actually, the chain resistance value of these 2,500 via-holes immediately after completion of plating was measured for comparison with a resistance value at the same substrate after a thermal shock test. This test was carried out under the following conditions.

(Test Conditions)

125° C., 120 minutes→room temp., 5 minutes→−65° C., 120 minutes, which comprises one cycle.

While an increase in cycle number of the thermal shock test results in a similar increase in the via-hole resistivity thus measured, a specific cycle number until the resistivity rise-up rate reaches 10% was used as a parameter that well reflects the reliability of such substrate. Thus, it can be said that the greater this cycle number, the higher will be the reliability of a substrate.

The above-noted thermal shock test indicated that a substrate sample was fabricated such that the resistance rise-up rate exceeded 10% after elapse of 180 cycles. This thermal shock test result demonstrates that the substrate exhibits sufficient reliability in view of build-up substrate connection reliability evaluation results; thus it has been confirmed that the wiring substrate manufacturing method of the present invention is capable of obtaining the intended wiring substrate with excellent connection reliability.

From the foregoing, it is apparent that the use of the electroless copper plating solution of the invention as disclosed herein, which provides excellent uniformity of deposition to the inside of via-holes, makes it possible to obtain substrates with excellent connection reliability; thus the effects of this embodiment could be confirmed.

(Embodiment 20)

A test was done, which is similar to that of Embodiment 19 using a plating solution and plating conditions are set forth below.

| Plating Solution Composition: | |
| --- | --- |
| copper sulfate pentahydrate | 0.04 mol/l |
| ethylene-diaminetetraacetic acid | 0.1 mol/l |
| formaldehyde | 0.03 mol/l |
| sodium hydroxide | 0.01 mol/l |
| triethyltetramine | 0.01 mol/l |

Note that the concentration of sodium hydroxide was appropriately adjusted so that pH=12.3 was established.

| Plating Conditions: | |
| --- | --- |
| pH | 12.3 |
| liquid temperature | 70° C. |

As a result, a substrate sample fabricated in this embodiment was such that the resistance rise-up rate exceeds 10% after elapse of 180 cycles in a similar way to that in Embodiment 19. This thermal shock test result suggests that the substrate exhibits sufficient reliability in view of build-up substrate connection reliability evaluation results; thus, it has been confirmed that the wiring substrate manufacturing method of the present invention is capable of obtaining the intended wiring substrate with excellent connection reliability.

From the foregoing, it is apparent that the use of the electroless copper plating solution of the invention as disclosed herein, which provides excellent uniformity of deposition to inside of via-holes, makes it possible to obtain substrates with excellent connection reliability; thus, the effects of this example could be confirmed.

(Embodiment 21)

A test was done, which is similar to that of Embodiment 19, using a plating solution and plating conditions are set forth below.

| Plating Solution Composition: | |
| --- | --- |
| copper sulfate pentahydrate | 0.04 mol/l |
| ethylene-diaminetetraacetic acid | 0.1 mol/l |
| formaldehyde | 0.03 mol/l |
| sodium hydroxide | 0.01 mol/l |
| mandelonitrile | 0.0005 mol/l |
| 2,2'-bipyridyl | 0.0002 mol/l |

Note that the concentration of sodium hydroxide was appropriately adjusted so that pH=12.5 was established.

| Plating Conditions: | |
|---|---|
| pH | 12.5 |
| liquid temperature | 74° C. |

As a result, a substrate sample fabricated in this embodiment was such that the resistance rise-up rate exceeds 10% after 200 cycles, which is a slightly better result than those of Embodiments 19 and 20. It is considered that this is because addition of 2,2'-bipyridyl results in improvement of the mechanical physical properties of the resulting plated film. Additionally this thermal shock test result demonstrates that the substrate exhibits sufficient reliability in view of build-up substrate connection reliability evaluation results; thus, it has been confirmed that the wiring substrate manufacturing method of the present invention is capable of obtaining the intended wiring substrate with excellent connection reliability.

From the foregoing, it is apparent that the use of the electroless copper plating solution of the invention as disclosed herein, which provides excellent uniformity of deposition to the inside of via-holes, makes it possible to obtain substrates with excellent connection reliability; thus, the effects of this embodiment could be confirmed.

(Embodiment 22)

A test was done, which is similar to that of Embodiment 19 using a plating solution and plating conditions as set forth below.

| Plating Solution Composition: | |
|---|---|
| copper sulfate pentahydrate | 0.04 mol/l |
| ethylene-diaminetetraacetic acid | 0.1 mol/l |
| formaldehyde | 0.03 mol/l |
| sodium hydroxide | 0.01 mol/l |
| eriochrome black T | 0.0002 mol/l |
| 2,2'-bipyridyl | 0.0002 mol/l |

Note that the concentration of sodium hydroxide was appropriately adjusted so that pH=12.5 was established.

| Plating Conditions: | |
|---|---|
| pH | 12.5 |
| liquid temperature | 74° C. |

As a result, as in Embodiment 21, a substrate sample fabricated in this embodiment was such that the resistance rise-up rate exceeds 10% after 200 cycles, which is a slightly better result than those of Embodiments 19 and 20. It is considered that this is because addition of 2,2'-bipyridyl results in improvement of the mechanical physical properties of the resulting plated film. Additionally, this thermal shock test result demonstrates that the substrate exhibits sufficient reliability in view of build-up substrate connection reliability evaluation results; thus, it has been confirmed that the wiring substrate manufacturing method of the present invention is capable of obtaining the intended wiring substrate with excellent connection reliability.

From the foregoing, it is apparent that the use of the electroless copper plating solution of the invention as disclosed herein, which provides excellent uniformity of deposition to the inside of via-holes, makes it possible to obtain substrates with excellent connection reliability; thus, the effects of this embodiment could be confirmed.

(Embodiment 23)

A test was done, which is similar to that of Embodiment 19 using a plating solution and plating conditions as set forth below.

| Plating Solution Composition: | |
|---|---|
| copper sulfate pentahydrate | 0.04 mol/l |
| ethylene-diaminetetraacetic acid | 0.1 mol/l |
| formaldehyde | 0.03 mol/l |
| sodium hydroxide | 0.01 mol/l |
| eriochrome black T | 0.0005 mol/l |
| 2,2'-bipyridyl | 0.0002 mol/l |

Note that the concentration of sodium hydroxide was appropriately adjusted so that pH=12.3 was established.

| Plating Conditions: | |
|---|---|
| pH | 12.3 |
| liquid temperature | 70° C. |

As a result, as in Embodiments 21–22, a substrate sample fabricated in this embodiment was such that the resistance rise-up rate exceeds 10% after 200 cycles, which is a slightly better result than those of Examples 19 and 20. It is considered that this is because addition of 2,2'-bipyridyl results in improvement of the mechanical physical properties of the resulting plated film.

Additionally, this thermal shock test result demonstrates that the substrate exhibits sufficient reliability in view of build-up substrate connection reliability evaluation results; thus, it has been confirmed also in the case of employing glyoxylic acid as the required reducing agent that the wiring substrate manufacturing method of the present invention is capable of obtaining the intended wiring substrate with excellent connection reliability.

From the foregoing, it is apparent that the use of the electroless copper plating solution of the invention as disclosed herein, which provides excellent uniformity of deposition to the inside of via-holes, makes it possible to obtain substrates with excellent connection reliability; thus, the effects of this embodiment could be confirmed.

COMPARATIVE EXAMPLE 1

The composition and plating process conditions of a plating solution, that was used for comparison with the various examples of the invention stated supra, are set forth below.

| Plating Solution Composition: | |
|---|---|
| copper sulfate pentahydrate | 0.05 mol/l |
| ethylene-diaminetetraacetic acid | 0.1 mol/l |
| formaldehyde | 0.03 mol/l |
| sodium hydroxide | 0.01 mol/l |

Note that the concentration of sodium hydroxide was appropriately adjusted so that pH=12.3 was established.

| Plating Conditions: | |
| --- | --- |
| pH | 12.3 |
| liquid temperature | 70° C. |

In this example for comparison purposes, the plating solution contains no additive agents. Its deposition uniformity and physical properties of the plated film have been evaluated by use of a test substrate, a physical property measurement plated film fabrication method and a deposition uniformity evaluation method, all of which are the same as those of Embodiment 1. In the plating solution used in this comparative example, the plating rate was measured to be 15.8 μm/h. After applying plating to the top surface of a test substrate for 1.5 hours, a plated film was formed to a thickness of about 24 μm. For the purpose of evaluation of its deposition uniformity, the cross-section or profile of each via-hole was observed and it was found that no plated film components were deposited within the via-holes and also that the deposition characteristics are at almost 0% with respect to all the via-holes concerned, including φ60 μm via-holes up to φ140 μm via-holes.

Further, the resultant plated film thus obtained using the plating solution under the plating conditions of the comparative example was very crumbly: our physical property evaluation results indicate that the degree of extensibility was less than 0.3%. In addition, the plating solution was undesirably decomposed after completion of plating processing for 2 hours, resulting in copper components being deposited on wall surfaces of the plating bath being used.

From the foregoing, it has been found that the plating solution of this comparative example containing therein no additive agents is less desirable or "bad" in deposition uniformity. Accordingly, it could be confirmed that the plating solution of the present invention containing mandelonitrile, triethyltetramine and/or eriochrome black T as stated previously provides excellent deposition uniformity, thus clearly establishing the presence of the effects of the plating solution of the invention. Additionally, the wiring substrate manufacturing method using the electroless copper plating solution of the above-noted comparative example is bad in uniformity of deposition to via-holes and also bad in mechanical characteristics of resultant plated film, which makes it impossible to provide any required wiring substrate reliability, and thus is not preferable in any way. From this fact also, it could be ascertained that the manufacturing method of the invention is very effective for use as wiring substrate manufacturing methodology, which is an advantage unique to the invention.

COMPARATIVE EXAMPLE 2

Next, the composition and plating conditions of a plating solution that was used in another example for comparison will be given below.

| Plating Solution Composition: | |
| --- | --- |
| copper sulfate pentahydrate | 0.05 mol/l |
| ethylene-diaminetetraacetic acid | 0.1 mol/l |
| formaldehyde | 0.03 mol/l |
| sodium hydroxide | 0.01 mol/l |
| 2,2'-bipyridyl | 0.0002 mol/l |

Note that the concentration of sodium hydroxide was appropriately adjusted so that pH=12.3 was established.

| Plating Conditions: | |
| --- | --- |
| pH | 12.3 |
| liquid temperature | 70° C. |

This comparative example is such that, while 2,2'-bipyridyl is contained as additive agent in a plating solution, this solution contains none of mandelonitrile, triethyltetramine and eriochrome black T, which are used as additive agents in order to improve the uniformity of deposition to via-holes. The deposition uniformity and physical properties of the plated film have been evaluated by use of a test substrate, a physical property measurement plated film fabrication method and a deposition uniformity evaluation method which are the same as those of Embodiment 1. In the plating solution used in this comparative example, the plating rate was 5.5 μm/h. After applying plating to the test substrate's top surface for 4.5 hours, a plated film was formed to a thickness of about 25 μm. Deposition uniformity measurement results are as follows: 25% for φ60 μm via-holes, 30% for φ80 μm via-holes, 57% for φ100 μm via-holes, 67% for φ120 μm via-holes, and 87% for φ140 μm via-holes. This suggests that the to the via-hole deposition uniformities are unacceptably inferior when compared to the samples of the invention that exhibit similar plating rates.

From the foregoing, it has been found that the plating solution of the comparative example containing therein none of the additive agents with effects for improving the deposition uniformity is bad in deposition uniformity. Accordingly, it could be confirmed that the plating solution of the present invention containing mandelonitrile, triethyltetramine and/or eriochrome black T is excellent in deposition uniformity, thus clearly establishing the presence of effects of the plating solution of the invention. Additionally the wiring substrate manufacturing method using the electroless copper plating solution of the above-noted comparative example is bad in uniformity of deposition to via-holes, which makes it impossible to achieve any required wiring substrate reliability, and thus is not preferable in any way. From this fact also, it could be ascertained that the manufacturing method of the invention is very effective for use as wiring substrate manufacturing methodology, which is an advantage unique to the invention.

COMPARATIVE EXAMPLE 3

Next, the composition and plating conditions of a plating solution that was used in yet another comparative example will be shown below.

| Plating Solution Composition: | |
| --- | --- |
| copper sulfate pentahydrate | 0.05 mol/l |
| ethylene-diaminetetraacetic acid | 0.1 mol/l |
| formaldehyde | 0.03 mol/l |
| sodium hydroxide | 0.01 mol/l |
| eriochrome black T | 0.0005 mol/l |

Note that the concentration of sodium hydroxide was appropriately adjusted so that pH=12.3 was established.

| Plating Conditions: | |
| --- | --- |
| pH | 12.3 |
| liquid temperature | 70° C. |

This comparative example is such that its plating solution contains therein eriochrome black T alone. The deposition uniformity and physical properties of the plated film have been evaluated by use of a test substrate, a physical property measurement plated film fabrication method and a deposition uniformity evaluation method, which are the same as those of Embodiment 1. In the plating solution used in this comparative example, the plating rate was measured to be 10.4 μm/h. After applying plating to the test substrate top surface for 2.4 hours, a plated film was formed to a thickness of about 25 μm. Precipitation uniformity measurement results are as follows: 18% for φ60 μm via-holes, 25% for φ80 μm via-holes, 33% for φ100 μm via-holes, 48% for φ120 μm via-holes, and 60% for φ140 μm via-holes. This suggests that the to-the-via-hole deposition uniformities are unacceptably less when compared to the embodiments of the invention containing 2,2'-bipyridyl and/or polyalkylene glycol.

From the foregoing, it has been found that the electroless copper plating solution of the comparative example with only eriochrome black T being mixed into the plating liquid is bad in deposition uniformity. Thus, it could be confirmed that the electroless copper plating solution of the present invention is excellent in precipitation uniformity, thus clearly establishing the presence of effects of the plating solution of the invention. Additionally the wiring substrate manufacturing method using the electroless copper plating solution of the above-noted comparative example is bad in uniformity of deposition to via-holes, which makes it impossible to achieve any required wiring substrate reliability, and thus is not preferable in any way. From this fact also, it could be ascertained that the manufacturing method of the invention is very effective for use as wiring substrate manufacturing methodology, which is an advantage unique to the invention.

Another Status of Embodiment 2

An explanation will next be given of a multilayer wiring substrate manufactured by the method of the present invention with reference to FIG. 2.

Figure 2:
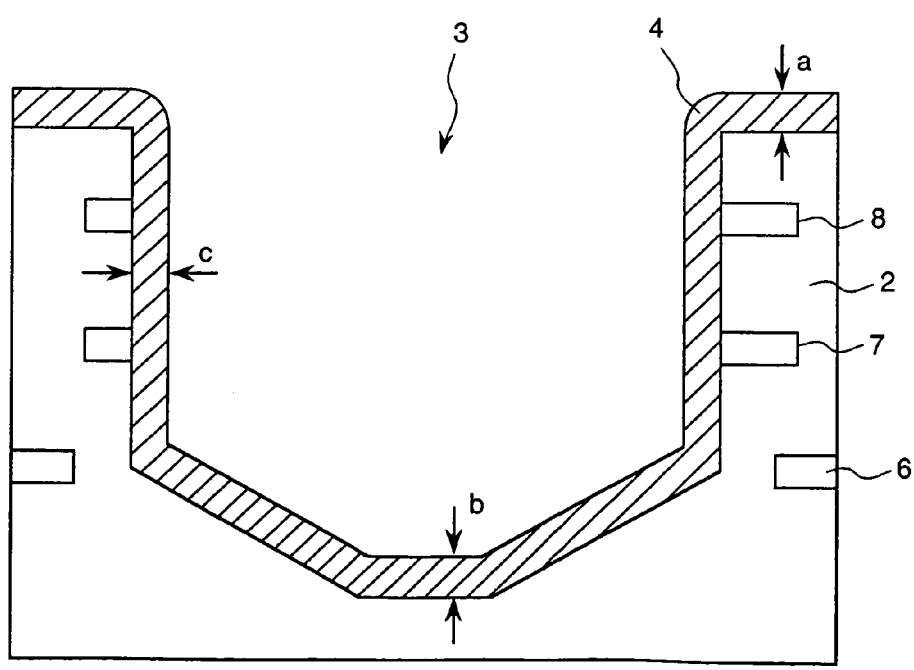
FIG. 2 is a diagram showing a sectional view of a main part of a multilayer wiring substrate as formed by a method incorporating the principles of this invention.

FIG. 2 depicts an enlarged sectional view of a main part of the multilayer wiring substrate, wherein a plurality of copper wiring lead layers 6, 7, 8 are formed inside of an electrical insulative or dielectric body 2 in such a manner, that for interconnection between the lead layers 7 and 8 by an electroless copper-plated layer 4, an opening portion 3 with one end of a via-hole being closed is provided at an upper surface of the dielectric body 2, while leaving the lead layers 7 and 8 be partly exposed. Thereafter, a continuous plated layer made of copper is coated by using the above-stated electroless copper plating solution of the present invention within the opening 3 and also on the upper surface of the dielectric body 2 to have an almost uniform thickness, i.e. in the state of a=b=c in the drawing. It should be noted that the opening 3 has its diameter φ ranging in value from 50 to 150 μm and also has a closed bottom portion at a position deeper than the diameter thereof, wherein the aspect ratio is so set as to fall within a range of 1.0 to 2.0. Also, note that this opening is desirably arranged as a circular groove when seen from the upper part, although it may be modified into the form of a rectangle or alternatively into an elongate rectangular groove when the need arises.

It should be apparent from FIG. 2 that the use of the copper-plated layer 4 of uniform thickness, coated on the bottom and wall surfaces within the opening, provides the required reliability of electrical connection between the lead layers 7 and 8. Especially, in the manufacture of large-scale multilayer wiring substrates with multiple openings each similar in structure to the opening 3, this is demonstrably advantageous for improvement of production yields thereof, while at the same time reducing the manufacturing costs.

Figure 3:
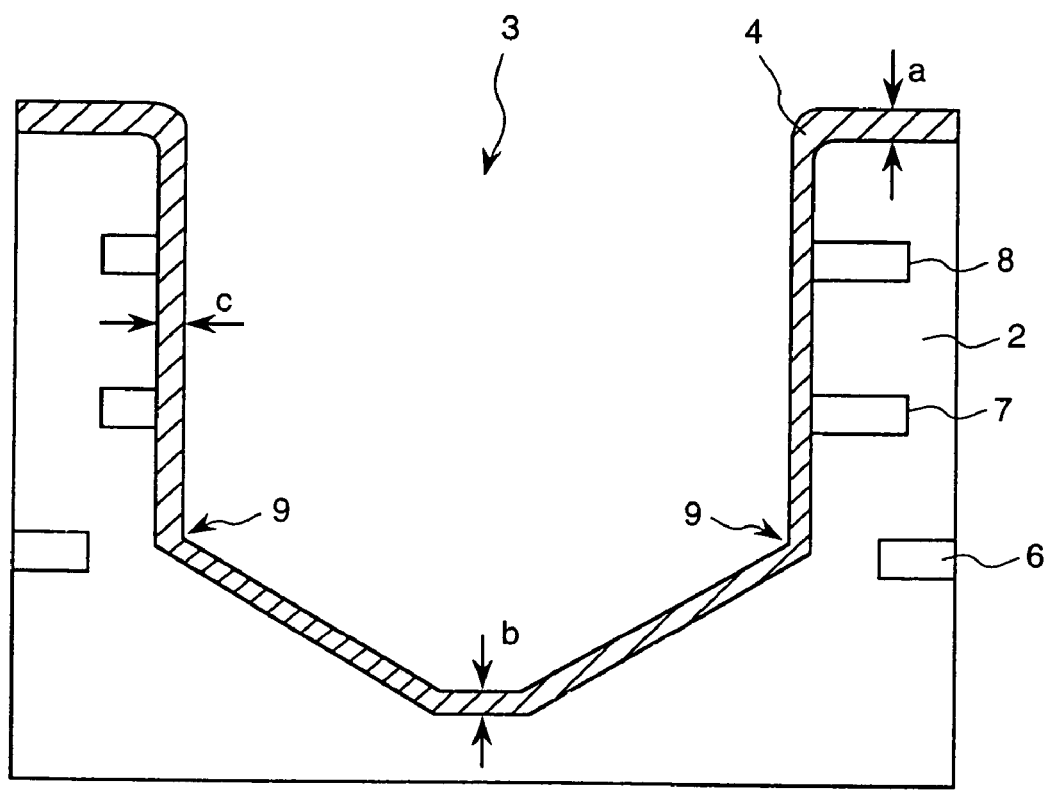
FIG. 3 is a diagram showing, in cross-section, a main part of a multilayer wiring substrate for illustrating comparative effects of the invention.

Turning now to FIG. 3, there is shown an enlarged sectional view of main part of a multilayer wiring substrate which is fabricated using the copper plating solution of the aforesaid comparative example 2 or 3, wherein a copper-plated film 4 coated on bottom and sidewall surfaces within an opening is such that its thickness values "b" and "c" are each less than a thickness "a" of copper-plated layer 4 coated on the upper surface of dielectric body 2, resulting in thickness irregular portions, such as recesses or "dimples", being formed at the copper-plated layer 4 per se, as indicated by numeral 9 in FIG. 3. Thus, there will no longer be any expectation to achieve the intended reliability of electrical connection between wiring lead layers 7 and 8.

As should be readily understandable from the foregoing explanation of the present invention based on various embodiments and examples, the present invention is very effective for obtaining, with increased reproducibility, a wiring structure with a copper-plated film of uniform thickness provided on inner wall and bottom surfaces of an opening of large aspect ratio having a closed bottom portion, which film has a thickness that is substantially the same as the thickness at the upper outside surface portions.

According to the present invention, it is possible to obtain at a connection portion of a via-hole structure, as can be seen in built-up substrates, an electroless copper plating solution capable of forming copper metals with increased uniformities. In addition, the use of this electroless copper plating solution makes it possible to obtain a wiring substrate with high wiring densities and high reliability, with inside surfaces of via-holes being uniformly subjected to copper plating processes.

What is claimed is:

1. A method for manufacturing a wiring substrate characterized by comprising the steps of providing in a dielectric body internally having a wiring layer more than one opening for letting said wiring layer be partly exposed, and applying electroless copper plating to a surface within said opening by use of an electroless copper plating solution characterized by containing therein at least one of a copper ion and a copper ion complexing agent with at least one of mandelonitrile and triethyltetramine being added thereto.

2. A method for manufacturing a wiring substrate characterized by comprising the steps of providing in a dielectric body internally having a wiring layer more than one opening for letting said wiring layer be partly exposed, and applying electroless copper plating to a surface within said opening by use of an electroless copper plating solution characterized by containing therein at least one of a copper ion, a complexing agent of the copper ion, and a reducing agent of the copper ion while comprising an additive agent of at least one of 2,2'-bipyridyl, 1,10-phenanthroline and 2,9-dimethyl-1,10-phenanthroline and further comprising an additive agent of at least one of mandelonitrile, triethyltetramine, and eriochrome black T.

* * * * *